United States Patent
Reichel et al.

(10) Patent No.: US 9,194,895 B2
(45) Date of Patent: Nov. 24, 2015

(54) THERMOELECTRIC POWER MEASUREMENT CELL AND CORRESPONDING MEASUREMENT METHOD

(75) Inventors: Thomas Reichel, Baldham (DE); Michael Katzer, Munich (DE); Toralf Bratfisch, Putzbrunn (DE); Werner Perndl, Vaterstetten (DE); Martin Hassler, Munich (DE); Andrea Deutinger, Pastetten (DE)

(73) Assignee: ROHDE & SCHWARZ GMBH & CO. KG (DE)

(*) Notice: Subject to any disclaimer, the term of this patent is extended or adjusted under 35 U.S.C. 154(b) by 336 days.

(21) Appl. No.: 13/129,456

(22) PCT Filed: Nov. 12, 2009

(86) PCT No.: PCT/EP2009/008060
§ 371 (c)(1),
(2), (4) Date: Jul. 27, 2011

(87) PCT Pub. No.: WO2010/054811
PCT Pub. Date: May 20, 2010

(65) Prior Publication Data
US 2012/0126786 A1    May 24, 2012

(30) Foreign Application Priority Data
Nov. 17, 2008 (DE) .......................... 10 2008 057 607

(51) Int. Cl.
*G01R 21/02* (2006.01)

(52) U.S. Cl.
CPC ..................................... *G01R 21/02* (2013.01)

(58) Field of Classification Search
CPC ................. G01J 5/12; G01J 5/14; G01J 5/16; G01J 5/20; G01J 5/22; G01K 17/006; G01R 21/02; G01R 21/04
USPC ................... 324/105, 95, 451, 142; 374/122; 257/467; 702/133; 327/512; 708/835
See application file for complete search history.

(56) References Cited

U.S. PATENT DOCUMENTS 3,486,014 A    12/1969  Richman
5,291,073 A *  3/1994  Lewandowski ............... 327/512
(Continued)

FOREIGN PATENT DOCUMENTS

| DE | 4117133 | 11/1992 |
| EP | 0209962 | 1/1987 |
| EP | 0779516 | 6/1997 |
| EP | 1004883 | 5/2000 |

(Continued)

OTHER PUBLICATIONS

Cong-Chao, H. et al., "A novel double-end heating type MEMS microwave power sensor", Solid-State and Integrated Circuit Technology, 2006. ICSICT, '06, 8th International Conference on, IEEE, PI, Oct. 1, 2006, pp. 581-583.

*Primary Examiner* — Thomas F Valone
(74) *Attorney, Agent, or Firm* — Fish & Tsang LLP

(57) ABSTRACT

A power measurement cell comprises at least one thermoelement (30) and at least two heating elements (20, 21, 25). A first heating element (20, 21) can be heated by a measurement signal. A temperature can be measured by means of the thermoelement (30). The two heating elements (20, 21, 25) have a very small spacing. The at least one thermoelement (30) and the two heating elements (20, 21, 25) have a high thermal coupling.

12 Claims, 8 Drawing Sheets

(56) References Cited

U.S. PATENT DOCUMENTS

| | | |
|---|---|---|
| 5,370,458 A | 12/1994 | Goff |
| 2003/0076085 A1 | 4/2003 | Kodato |
| 2007/0176768 A1 | 8/2007 | Scott |
| 2008/0252298 A1* | 10/2008 | Noujeim ............... 324/451 |

FOREIGN PATENT DOCUMENTS

| | | |
|---|---|---|
| EP | 1043595 | 10/2000 |
| SK | 279550 | 12/1998 |
| WO | 9705493 | 2/1997 |

* cited by examiner

THERMOELECTRIC POWER MEASUREMENT CELL AND CORRESPONDING MEASUREMENT METHOD

The invention relates to a thermoelectric power-measurement cell and a method for the thermoelectric measurement of power.

The use of thermo-elements for the measurement of electrical power, especially microwave power in the range from 1 GHz to 110 GHz is known. A measurement circuit is conventionally calibrated before its initial operation. However, measurement circuits do not remain stable over a long period. For this reason, measuring devices of this kind must be re-calibrated at regular intervals.

Accordingly, US 2007/0176768 A1 discloses a microwave power sensor. This contains two heating resistors and several thermo-elements. The heating resistors are attached in each case to different ends of the thermo-elements. The first heating resistor is connected to the microwave signal. In a first measurement method, only this first heating resistor is heated by the microwave signal. Moreover, in a second measurement method, the second heating resistor is connected to a direct current DC. In this context, the direct current is adjusted in such a manner that the thermo-elements output a voltage of 0V. In this condition, the ends of the thermo-elements provide an identical temperature. The power of the microwave signal then corresponds to the power of the known direct current. Although this method increases the measurement accuracy by comparison with the first method, it is disadvantageous that with an increasing power of the microwave signal, increasingly more power is converted in the sensor. This leads to a low power-carrying capacity of the sensor. Furthermore, a large space requirement results from the two spatially and thermally separated heating elements.

The invention is based upon the object of providing a power-measurement cell and a method for power measurement, which achieve a small space requirement, good measurement accuracy, a high power-carrying capacity and a good long-term stability.

The power-measurement cell according to the invention contains at least one thermo-element and at least two heating elements. A first heating element can be heated by a measurement signal. A temperature can be measured by means of the thermo-element. The two heating elements provide a very small spacing distance. The at least one thermo-element and the two heating elements provide a very strong thermal coupling. In this manner an accurate measurement is guaranteed with a small space requirement. Verification of the calibration of the power-measurement cell is possible. A good long-term stability is achieved in this manner.

The heating elements are preferably arranged on one side of the thermo-element and preferably heat the one side of the thermo-element. This provides a large temperature difference between the two sides of the thermo-element and accordingly a high measurement-signal level.

A verification of a calibration of the power-measurement cell can preferably be implemented by means of the second heating element. Accordingly, it is possible to determine when the measurement accuracy of the power-measurement cell has fallen below a given level and a re-calibration must be implemented.

The at least one thermo-element preferably comprises a pairing of a copper-nickel alloy and copper. In this manner, a sufficiently high thermo-voltage is possible with the use of tested materials. Accordingly, a simple manufacture using thin-layer methods is possible.

The power-measurement cell preferably contains several thermo-elements. The several thermo-elements are preferably connected, at least in part, in series. The series-connected thermo-elements preferably form at least one thermal stack. Accordingly, an increase in the thermo-voltage by a multiple factor is possible. This improves measurement accuracy.

The heating elements and the at least one thermo-element are advantageously disposed on a membrane. The thermal conductivity of the membrane preferably determines the measurement accuracy and the power-carrying capacity of the power-measurement cell. In this manner, a controlled thermal dissipation is possible. An accurate adjustment of the measurement accuracy and the power-carrying capacity of the power-measurement cell is also possible in this manner.

By preference, the membrane comprises silicon oxide and/or silicon. Accordingly, the use of a standard silicon technology is possible.

In order to verify a calibration of the power-measurement cell, the second heating element can preferably be supplied with at least one verification signal of known power. When supplied with the verification signal, the second heating element heats the thermo-element to a largely known temperature. A verification device preferably determines at least the measured value of the at least one thermo-element at the at least one largely known temperature, records the latter and compares it with the known power of the verification signal. Accordingly, a monitoring of the measurement accuracy is possible. If a re-calibration is implemented, when the accuracy declines, a very good long-term stability can be achieved.

The second heating element can advantageously be controlled with a substitution signal in such a manner that the temperature determined by the thermo-element is largely constant independently of the measurement signal. The power of the measurement signal is preferably determined from the substitution signal. Accordingly, the power converted in the power-measurement cell is constant independently of the measurement signal. Non-linear effects are accordingly avoided. A good power-carrying capacity is achieved in this manner.

The verification signal and the substitution signal are preferably direct-current signals. Accordingly, a simple signal processing and an accurate measurement are possible.

The power-measurement device preferably contains a bridging circuit. This bridging circuit advantageously comprises two paths. The bridging circuit preferably contains the thermo-element in one of the paths. An amplified measurement signal of the measurement bridge advantageously controls the second heating element. A simple control of the thermal power in the heating elements is possible in this manner.

With the method according to the invention for measuring the electrical power of a measurement signal, a first heating element can be heated by the measurement signal. At least one thermo-element measures a temperature which corresponds substantially to the temperature of the first heating element. The temperature measured at the first heating element is used to determine a power of the measurement signal. A second heating element is supplied with a substitution signal while the first heating element is supplied with the measurement signal, or a verification of a calibration of the measurement of the power is implemented by means of a second heating element. The at least one thermo-element and the two heating elements are preferably strongly thermally coupled. Accordingly, an accurate measurement is guaranteed with a small space requirement. A monitoring of the long-term stability is possible as a result of the verification of the calibration. Through the substitution, a constant converted power in the power-measurement device is achieved.

In order to verify the calibration of the measurement of the power, the following steps are preferably implemented:
switching off the first heating element;
supplying a second heating element with a verification signal of known power;
determining the power measured by the thermo-element; and
comparing the power measured by the thermo-element with the known power of the verification signal.

In this manner, a monitoring of the measurement accuracy is possible. A correction of deviations of the measured values from an ideal linear characteristic is also possible.

As an alternative, the second heating element is preferably controlled with a substitution signal in such a manner that variations of the measurement signal determined by the thereto-element are compensated. The temperature determined by the thermo-element is preferably largely constant independently of the measurement signal. The power of the measurement signal is advantageously determined from the substitution signal. Accordingly, a constant power is converted in the power-measurement device. This prevents measurement inaccuracies resulting from temperature drift and other non-linear effects.

Several thermo-elements are preferably used. The signals of the several thermo-elements are added at least in part. The thermo-elements of which the signals are added preferably form at least one thermal stack. Accordingly, an increase in the thermo-voltage by a multiple factor is possible. This improves measurement accuracy.

The invention is described by way of example on the basis of the drawings, which present an advantageous exemplary embodiment of the invention. The drawings are as follows.

Figure 4:
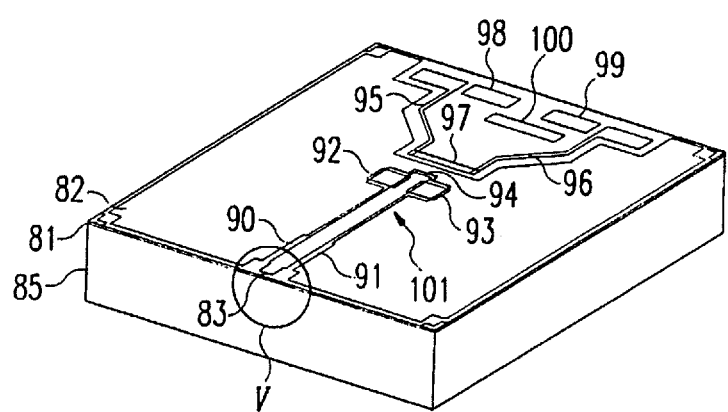
FIG. 4 shows a detailed third exemplary embodiment of the power-measurement cell according to the invention in a perspective view.
Figure 5:
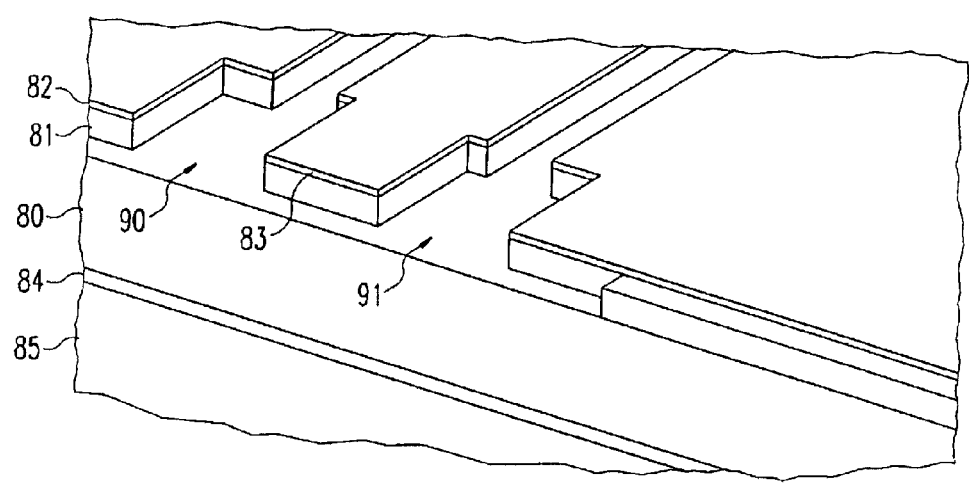
FIG. 5 shows the laminar structure associated with FIG. 4 in an enlarged perspective view.
Figure 6:
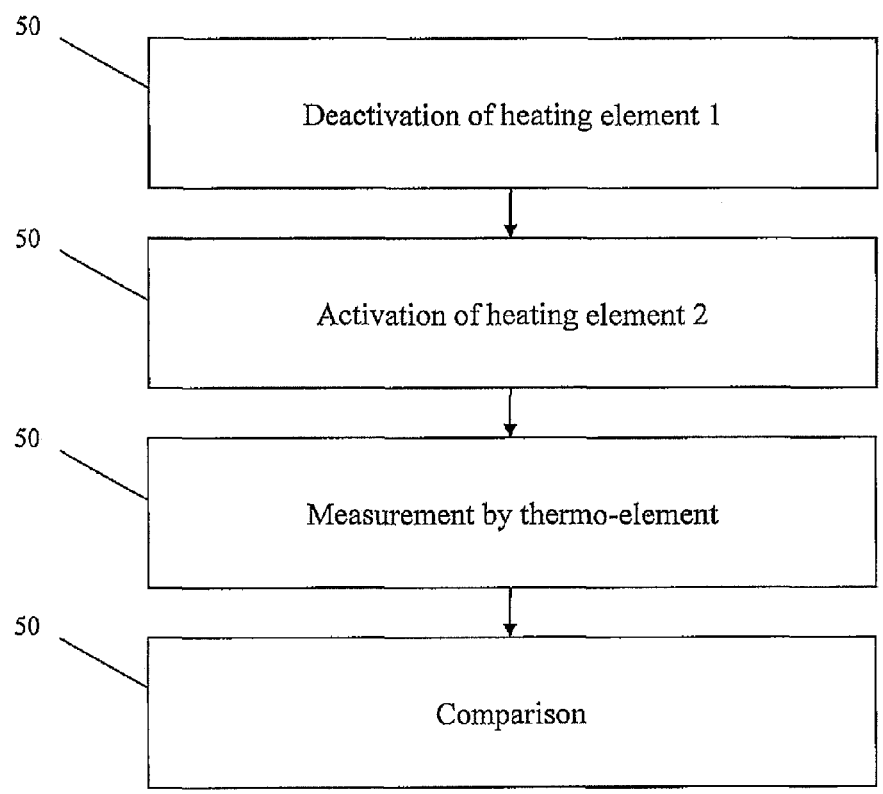
FIG. 6 shows a flow chart of the first exemplary embodiment of the method according to the invention.
Figure 7:
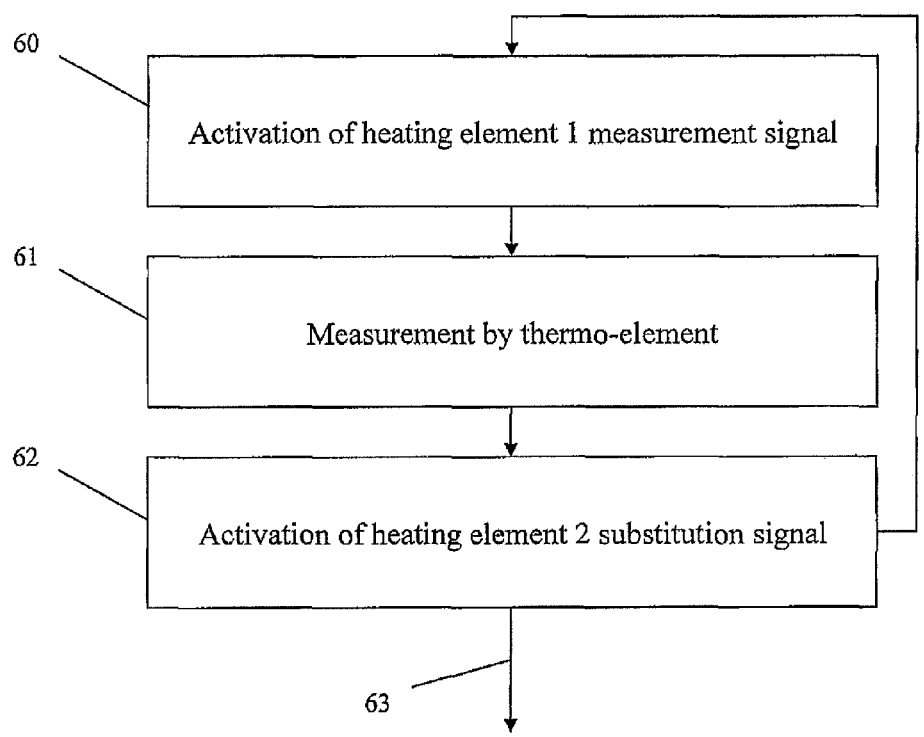

FIG. 7 shows a flow chart of a second exemplary embodiment of the method according to the invention; and Initially, on the basis of FIGS. 1-5, the structure and functioning of the power-measurement cell according to the invention are explained. With reference to FIGS. 6 and 7, the functioning of the method according to the invention is then presented. The presentation and description of identical elements in similar drawings has not been repeated in some cases.

Figure 1:
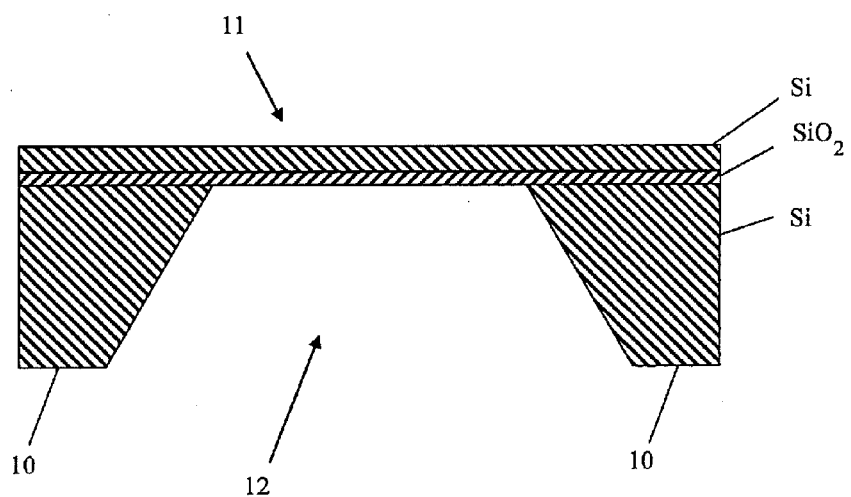
FIG. 1 shows the structure of a first exemplary embodiment of the power-measurement cell according to the invention in cross-section.

FIG. 1 shows a first exemplary embodiment of the power-measurement cell according to the invention in a sectional view. The power-measurement cell according to the invention contains a silicon substrate 12. By means of oxidation of the surface and selective etching, a membrane 11 and a frame 10 of silicon are formed from the silicon substrate 12. In this context, the membrane consists of a lower silicon-oxide layer and an upper silicon layer. For this purpose, a silicon oxide layer is applied to an originally pure silicon substrate, and a new silicon layer is then applied to the latter. A part of the silicon of the substrate is removed by etching on the rear side. A recess 13 in the silicon substrate 12 is provided as a result. With the additional un-removed silicon layer above the silicon-oxide layer, a thin, but stable membrane 11 is obtained. As an alternative, the membrane can comprise a single, relatively thicker silicon-oxide layer.

Further components of the power-measurement cell are arranged on the front side of the membrane 11, as shown in the following section.

Figure 2:
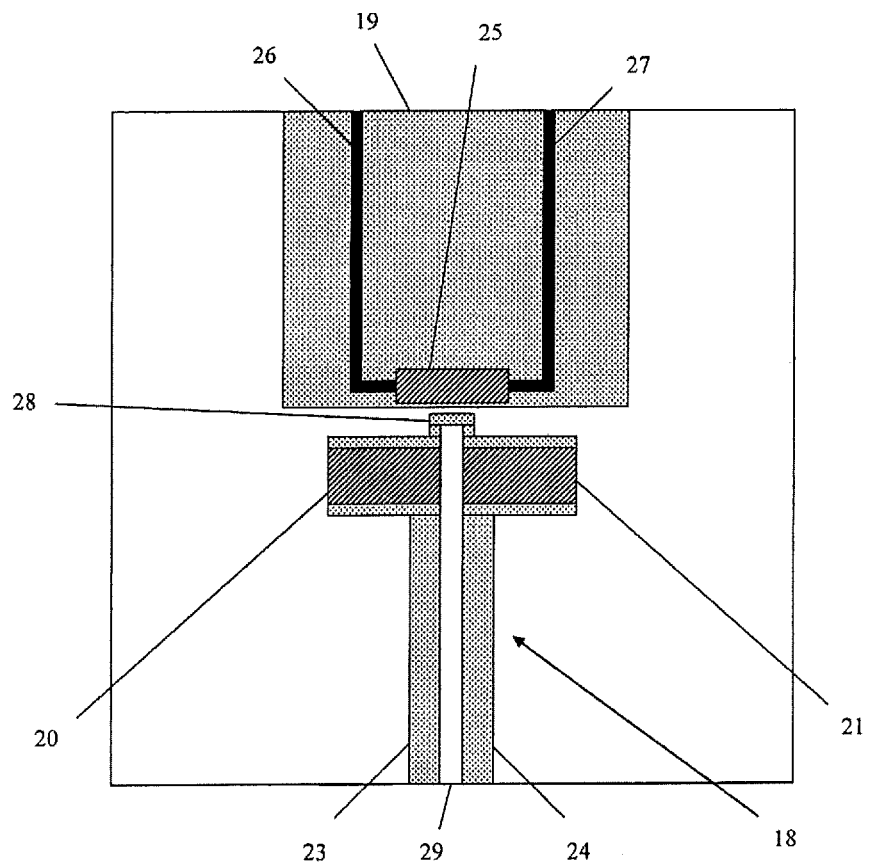
FIG. 2 shows the structure of the first exemplary embodiment in plan view.

FIG. 2 presents the exemplary embodiment of the power-measurement cell according to the invention in a plan view. Here, the upper side of the illustration from FIG. 1 is shown. A coplanar line 18 is formed from the middle line 29, three recesses 23, 24, 28 and a surrounding metallisation 22. The coplanar line is connected to two heating resistors 20, 21. The two resistors 20, 21 are connected on their side facing away from the coplanar line to the surrounding metallisation 22 and accordingly to an earth connection. The two heating resistors 20, 21 accordingly form a common, earthed heating resistor 29. A first stripline 26 is connected to a third heating resistor 25. The side of the third heating resistor 25 facing away from the first stripline 26 is connected to a second stripline 27. The striplines 26, 27 and the heating resistor are disposed within a recess 19 of the metallisation 22. Other forms of line can also be used instead of striplines and coplanar lines.

The structure described above is built up on the upper side of a silicon substrate 12, as indicated in the section on FIG. 1. In this context, the heating resistors 20, 21, 25 are arranged in the centre of the membrane 11. The frame 10 provides structural stability for the power-measurement cell. Furthermore, the frame 10 is very strongly thermally coupled to a device housing, and accordingly represents an almost ideal temperature sink.

A measurement signal is fed in via the coplanar line 18. The measurement signal is earthed via the heating resistors 20, 21. The measurement signal accordingly heats the heating resistors 20, 21. The thermal power converted in the heating resistors is proportional to the power of the measurement signal. Since the heating resistors 20, 21 are attached to the membrane 11, the thermal power introduced cannot immediately dissipate. Instead, an equilibrium temperature of the membrane 11 is established. The power of the measurement signal can be inferred from this equilibrium temperature. The heating resistors 20, 21, 25 here represent possible embodiments of the heating elements according to the invention.

As shown below with reference to FIG. 3a, this equilibrium temperature is measured by means of at least one thermo-element 30.

A signal can be fed in via the first stripline 26. The signal is transmitted via the third heating resistor 25 to the second stripline 27. In this context, the heating resistor 25 is heated by the signal in a similar manner to the heating resistors 20, 21. The thermal power converted in the third heating resistor 25 is proportional to the power of the signal. In the case of a single supply of the signal, an equilibrium temperature is also obtained.

On the basis of the close spatial proximity of the first and second heating resistors 20, 21 to the third heating resistor 25, a strong thermal coupling of these components is achieved. A temperature increase in one of the heating resistors 20, 21, 25 leads to an approximately equally large temperature increase in all other heating resistors 20, 21, 25. The temperature of the heating resistors 20, 21, 25 is approximately identical here. With regard to the common temperature of the heating resistors 20, 21, 25, it is therefore irrelevant, in which of the heating resistors 20, 21, 25 the power is converted.

Figure 3A:
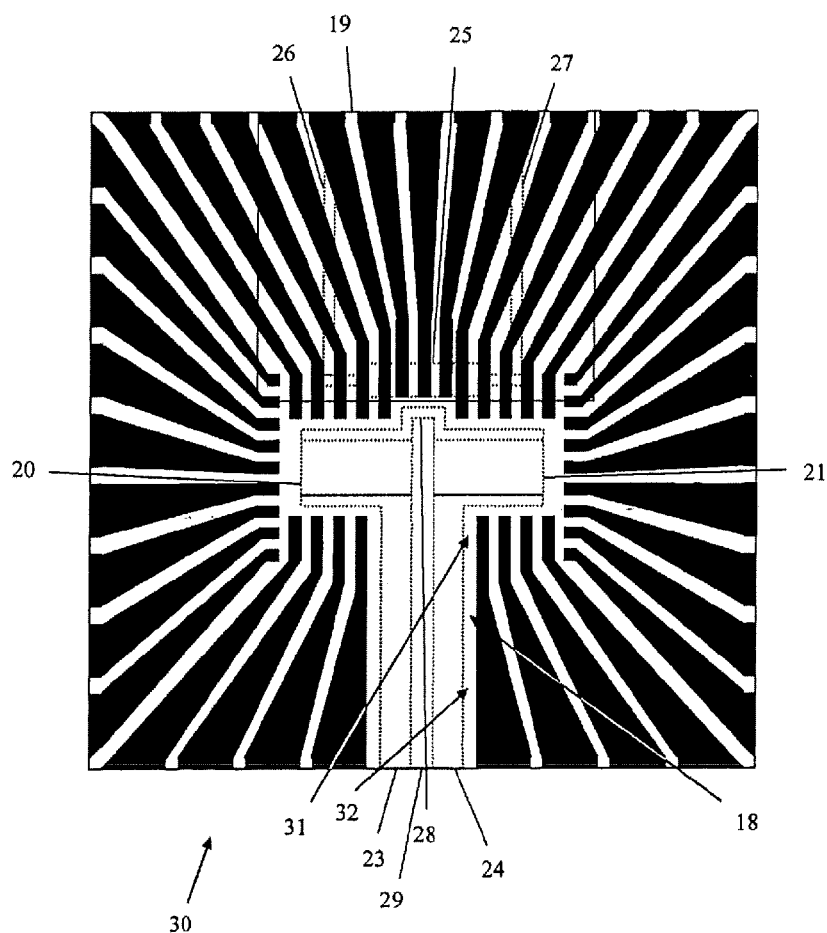
FIG. 3a shows the structure of the first exemplary embodiment in plan view in a laminar plane different from FIG. 2.

FIG. 3a shows another laminar plane of the first exemplary embodiment of the power-measurement cell according to the invention. Accordingly, a plurality of thermo-elements 30 is presented. The thermo-elements 30 here are arranged in a galvanically separated manner via the structures presented in FIG. 2. For the sake of improved visibility, the structures presented in FIG. 2 have been additionally shaded here, although they are arranged in another position of the power-measurement cell. These thermo-elements 30 each comprise an active region 31 and supply lines 32. The active region 31 comprises a connection of a copper contact with a copper-nickel contact. The copper contact and also the copper-nickel contact provide their own supply lines 32, which are arranged one above the other but with galvanic separation from one another. The galvanic separation of the supply lines 32 arranged one above the other is achieved by an insulating layer disposed between them. The thermo-elements 30 are also galvanically separated at the top and bottom by insulating layers. The totality of the insulating layers, the copper layer and the copper-nickel layer is referred to here as a thermo-element layer.

An arrangement of the supply lines side-by-side without insulating layer is possible as an alternative. This is explained in greater detail with reference to FIG. 3b.

The active regions 31 of the thermo-elements 30 in this context are disposed at a largely constant spacing distance from an external limit of one of the heating resistors 20, 21 from FIG. 2, and are identical in extension. The active regions 31 are disposed at a small spacing distance from the heating resistors 20, 21, 25. In this manner, a largely identical temperature and accordingly a largely identical output signal of the active regions 31 of the thermo-element 30 is guaranteed when the heating resistors 20, 21 are supplied with a measurement signal or the heating resistors 25 with a further signal.

The supply lines 32 connect the active regions 31 of the thermo-elements 30 to the edge of the power-measurement cell. The second side of the thermo-elements is therefore disposed in the region of the edge of the power-measurement cell and therefore at a constant ambient temperature level. The signals of the thermo-elements 30 are picked up there. The supply lines 32 are arranged in such a manner that they cover a large part of the area of the power-measurement cell. The spacing distance between each of the adjacent supply lines 32 is largely constant.

In order to increase the signal level, the thermo-elements 30 are connected, at least in part, in series. The series-connected thermo-elements form thermal stacks. To avoid electromagnetic scattering, a reversal of the direction of flow of the electrical current through some of the thermo-elements 30 is possible. Accordingly, electromagnetic scattering, which occurs in a first part of the thermo-elements 30 with identical flow direction of the electrical current, is compensated by the electromagnetic scattering which occurs in the second part of the thermo-elements 30 with reversed flow direction of the electrical current. By preference, respectively adjacent thermo-elements provide a different current direction. Disturbances are largely cancelled through the largely constant spacing distance between adjacent thermo-elements 30.

Figure 3B:
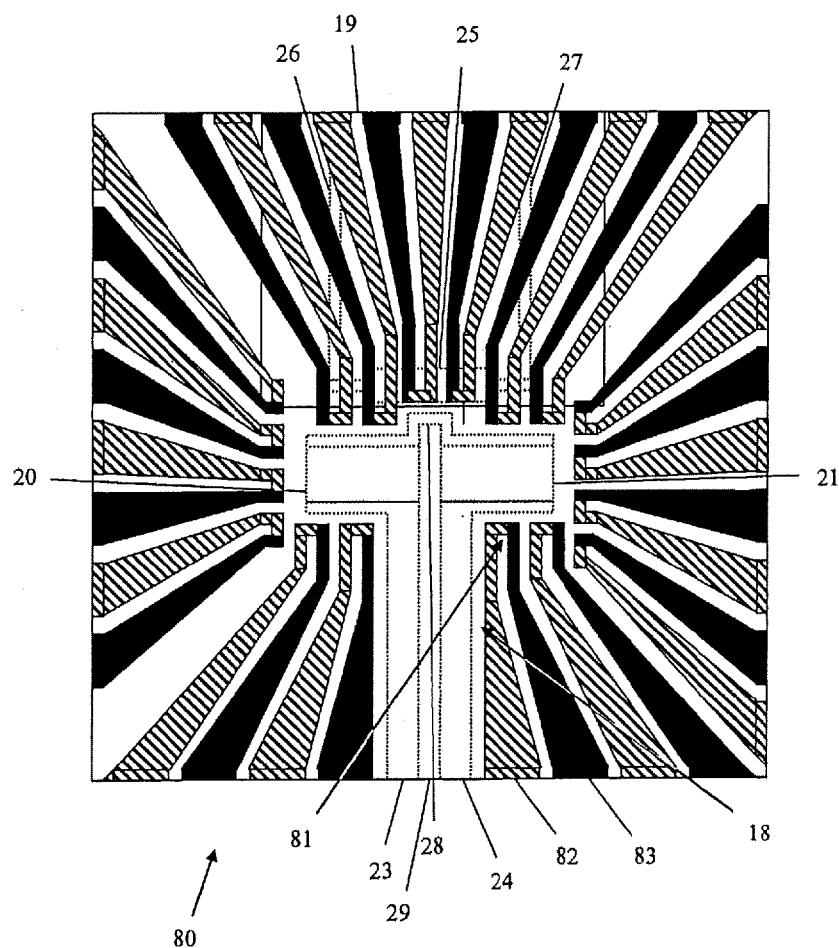
FIG. 3b shows the structure of a second exemplary embodiment in plan view.

The exemplary embodiment presented in FIG. 3b corresponds largely to the exemplary embodiment presented in FIG. 3a. However, the different materials of the thermo-elements 80 are not disposed one above the other in different layers, but side-by-side in a single layer. Accordingly, every thermo-element 80 is formed by a copper-nickel supply line 82, a copper supply line 83 and an active region 81. The thermo-element layer in this exemplary embodiment does not contain an insulating layer which separates the copper layer and the copper-nickel layer. This structure allows a simpler manufacture.

FIG. 4 presents a detailed third exemplary embodiment of the power-measurement cell according to the invention. A thermo-element layer 81 is applied to a silicon substrate 85. Further layers, which will be described in greater detail with reference to FIG. 5, are disposed between these. The thermo-element layer 81 comprises two silicon-nitride layers, between which the thermo-elements comprising a copper layer and copper-nickel layer are embedded. These silicon-nitride layers provide the galvanic separation of the thermo-elements from the substrate and the layers disposed above. If the copper layer and the copper-nickel layer are disposed one above the other, an additional silicon-nitride layer is optionally applied between these. A resistor layer made of nickel-chromium alloy, from which the heating resistors 92, 93, 97 are formed, is applied to the thermo-element layer 81. Furthermore, a gold layer 82 is applied to the thermo-element layer 81 and to the resistor layer. This gold layer is used for the contacting of the various components and for the electromagnetic screening of the power-measurement cell.

The heating power is introduced into the heating resistor 97 by means of the striplines 95, 96. The connections 98, 99 are used for the contacting of the thermo-elements. The connection 100 is used for reversing the current direction through one part of the thermo-elements. As already described, this provides improved compensation of electromagnetic interference. A crossing of the lines of the thermo-elements is required for this purpose. This crossing can be achieved simply by omitting the laminar plane of the thermo-elements. Accordingly, the striplines 95, 96 and also the connections 98, 99, 100 are formed by the gold layer 82.

The measurement signal is supplied to the heating resistors 92, 93 by means of a coplanar line 101. The coplanar line 101 is formed here by the middle line 83, the three recesses 90, 91, 94 and the remaining metallisation of the gold layer 82. The middle line 83 is also formed by the gold layer 82. The middle line 83 is further insulated from the remaining metallisation of the gold layer 82 by means of the recess 94. Accordingly, the heating resistors are connected directly between the middle conductor 83 and the remaining metallisation of the gold layer 82. In the exemplary embodiment, they each provide a terminal resistance of 100 ohms. Accordingly, in combination, a termination of the coplanar line of 50 ohms is obtained. The coplanar line 101 also provides a surge impedance of 50 ohms. Within a very broad frequency range, hardly any reflections therefore occur in the heating resistors 92, 93.

The region V in FIG. 4 is shown in enlargement in FIG. 5 and is described in greater detail below.

FIG. 5 shows the layered structure associated with FIG. 4 in an enlarged perspective view. An etching stop layer 84 of silicon oxide is applied to the silicon substrate 85 illustrated in FIG. 4. The etching stop layer 84 ensures the defined termination of the etching process with which the substrate is removed below the membrane 11 as explained with reference to FIG. 1. A further silicon layer 80 is applied to the etching stop layer 84. This layer ensures the mechanical stability of the membrane 11. The thermo-element layer 81 described in greater detail with reference to FIG. 4 is applied directly to the silicon layer 80. The gold layer 84 explained with reference to FIG. 4 is applied to the thermo-element layer 81.

The recesses 90, 91, which separate the middle conductor from the remaining metallisation of the gold layer 82, are formed in the gold layer 82 and also in the thermo-element layer 81. A secure galvanic separation is guaranteed in this manner. These recesses 90, 91 are structured in such a manner that the coplanar line 101 shown in FIG. 4 provides a constant surge impedance of 50 ohms over its length. For this purpose, the recesses 90, 91 are designed with a width which reduces stepwise in the direction towards the heating resistors 92, 93. These steps are provided in the structuring of the rear side. Accordingly, in the region of the frame 10, a larger width is necessary in order to achieve the constant surge impedance than in the region of the membrane 11.

FIG. 6 shows a flow chart of a first exemplary embodiment of the method according to the invention. The thermo-elements 30 and also the heating resistors 20, 21, 25 vary slightly over the course of time. This leads to a poor long-term stability of the measurement results. In order to compensate this effect, verification measurements are implemented. In a verification measurement, the feeding of the measurement signal into the heating resistors 20, 21 is interrupted in a first step 50. In a second step 51, a verification signal is fed into the third heating resistor 25. In this context, the power of the verification signal is known. For the verification, it is assumed that variations of the third heating resistor 25 correspond to the variations of the first and second heating resistor 20, 21.

Upon feeding the verification signal into the third heating resistor 25, a thermal power occurs there. As explained with reference to FIG. 2, a thermal equilibrium and therefore an equilibrium temperature is established. By means of the thermo-element 30, this equilibrium temperature is determined in a third step 52. In a fourth step 53, the known power of the verification signal is compared with the measured power. This calculation is implemented by an external verification device which is not illustrated. A further increase in accuracy can be achieved by determining compensation values. These are used for error correction of every future measurement value. Accuracy can be further improved by repeating steps 51 to 53 for different known powers of the verification signal.

FIG. 7 shows a flow chart of a second exemplary embodiment of the method according to the invention. Conventionally, only the first and second heating element 20, 21 are used in the measurement. However, this leads to the disadvantage that the power converted in the power-measurement cell is proportional to the power of the measurement signal. This leads to non-linear effects which cannot be completely eliminated. In order to achieve particularly accurate measurement results, the power-measurement cell is operated in the so-called substitution mode. The heating elements 20, 21, 25 are connected to one another, for example, via a bridging circuit. In this context, the wiring is preferably implemented in such a manner that the power jointly converted by the heating elements 20, 21, 25 is constant. This is achieved by a substitution signal which is fed into the third heating element 25. Accordingly, the substitution signal always has a power which corresponds to the difference between the desired constant total power and the power of the measurement signal. The power of the measurement signal is calculated here on the basis of the known substitution signal.

For the power measurement in the substitution mode, a measurement signal is supplied to the heating resistors 20, 21 in a first step 60. In a second step 61, the resulting equilibrium temperature is determined by means of the thermo-elements 30. In a third step 62, a substitution signal is fed into the third heating element 25. The substitution signal is known and provides a power which corresponds to the difference between the desired total power and the power occurring in the heating elements 20, 21. The substitution signal is determined here by holding the temperature in the thermo-elements 30 at a constant, desired level. The power of the measurement signal is determined on the basis of the known substitution signal.

The invention is not restricted to the exemplary embodiment described. As already mentioned, different materials can be used for the thermo-elements. The use of a larger number of heating elements is also conceivable. All of the features described above or illustrated in the drawings can be advantageously combined with one another as required within the framework of the invention.

Key to Diagrams
FIGS. 1 to 5
n/a

| FIG. 6 | |
|---|---|
| 50 | Deactivation of heating element 1 |
| 50 [??] | Activation of heating element 2 |
| 50 [??] | Measurement by thermo-element |
| 50 [??] | Comparison |

| FIG. 7 | |
|---|---|
| 60 | Activation of heating element 1 measurement signal |
| 61 | Measurement by thermo-element |
| 62 | Activation of heating element 2 substitution signal |

The invention claimed is:

1. A power-measurement cell on a silicon substrate with at least one thermo-element and at least two heating elements,
    wherein a first heating element is heated by a measurement signal,
    wherein a temperature is measured via the thermo-element,
    wherein the two heating elements provide a spacing distance, so that a temperature increase in one of the heating elements leads to an approximately equally large temperature increase in all other heating elements and therefore leads to an identical common temperature in all heating elements,
    wherein the at least one thermo-element and the two heating elements provide a thermal coupling;
    wherein the heating elements and the at least one thermo-element are arranged on a membrane, wherein the membrane is formed from a lower silicon-oxide layer and an upper silicon layer, and wherein the membrane is formed in a recess in the silicon substrate such that thermal conductivity of the membrane determines measurement accuracy and power-carrying capacity of the power-measurement cell;
    wherein the at least one thermo-element is directly applied to the upper silicon layer of the membrane to establish an equilibrium temperature and wherein the heating elements are applied to the thermo-element;
    a verification device coupled to the second heating element, wherein the verification device and power-measurement cell are configured such that
    (a) a second heating element is supplied with a verification signal of known power by the verification device to verify a calibration of the power-measurement cell;
    (b) when supplied with the verification signal, the second heating element heats the thermo-element to at least one known temperature; and (c) the verification device is further configured to determine the measurement value of the at least one thermo-element at the at least one known temperature, to record the measurement value, to compare the measurement value with the power of the verification signal to determine compensation values for compensating future measurement values, and to determine if recalibration is necessary.

2. The power-measurement cell according to claim 1, wherein the heating elements are arranged on one side of the thermo-element, and wherein the heating elements heat the one side of the thermo-element.

3. The power-measurement cell according to claim 1, wherein the at least one thermo-element comprises a pairing of a copper-nickel alloy and copper.

4. The power-measurement cell according to claim 1, wherein the power-measurement cell contains several thermo-elements, wherein the several thermo-elements are connected at least in part in series, and wherein the series-connected thermo-elements form at least one thermal stack.

5. The power-measurement cell according to claim 1, wherein the second heating element is controlled with a substitution signal in such a manner that the temperature determined by the thermo-element is largely constant independently of the measurement signal, and wherein the power of the measurement signal is determined from the substitution signal.

6. The power-measurement cell according to claim 5, wherein the substitution signal is a direct-current signal.

7. The power-measurement cell according to claim 1, wherein the verification signal is a direct-current signal.

8. A method for measuring the electrical power of a measurement signal with a power measurement cell on a silicon substrate, the method comprises the following steps:
   heating a first heating element by the measurement signal,
   measuring a temperature by a thermo-element which corresponds substantially to the temperature of the first heating element,
   determining a power of the measurement signal by using the measured temperature of the first heating element,
   supplying a second heating element with a substitution signal while the first heating element is supplied with the measurement signal, or
   implementing a verification of a calibration of the measurement of the power via a second heating element,
   wherein the at least one thermo-element and the two heating elements are thermally coupled, wherein a temperature increase in one of the heating elements leads to an approximately equally large temperature increase in all other heating elements and therefore leads to an identical common temperature in all heating elements;
   wherein the heating elements and the at least one thermo-element are arranged on a membrane, wherein the membrane is formed from a lower silicon-oxide layer and an upper silicon layer, and wherein the membrane is formed in a recess in the silicon substrate such that thermal conductivity of the membrane determines measurement accuracy and power-carrying capacity of the power-measurement cell
   wherein the at least one thermo-element is directly applied to the upper silicon layer of the membrane to establish an equilibrium temperature and wherein the heating elements are applied to the thermo-element;
   wherein in order to verify a calibration of the power-measurement cell, a second heating element is supplied with a verification signal of known power;
   wherein, when supplied with the verification signal, the second heating element heats the thermo-element to at least one known temperature; and
   wherein a verification device coupled to the heating element determines the measurement value of the at least one thermo-element at the at least one known temperature, records the measurement value, compares the measurement value with the power of the verification signal to determine compensation values for compensating future measurement values, and determines if recalibration is necessary.

9. The method according to claim 8, wherein in order to verify the calibration of the measurement of the power, the following step is implemented: switching off the first heating element.

10. The method according to claim 8, wherein the second heating element is controlled with the substitution signal in such a manner that variations of the measurement signal determined by the thermo-element are compensated, and that the temperature determined by the thermo-element is largely constant independently of the measurement signal, and that the power of the measurement signal is determined from the substitution signal.

11. The method according to claim 8, wherein the verification signal and the substitution signal are direct-current signals.

12. The method according to claim 8, wherein several thermo-elements are used, that the signals of the several thermo-elements are added at least in part, and that the thermo-elements of which the signals are added form at least one thermal stack.

* * * * *